United States Patent
Chen et al.

(10) Patent No.: US 8,912,015 B2
(45) Date of Patent: Dec. 16, 2014

(54) OPERATING METHOD OF HARDWIRED SWITCH

(75) Inventors: Ting-Sheng Chen, Hsinchu (TW); Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 324 days.

(21) Appl. No.: 13/477,057

(22) Filed: May 22, 2012

(65) Prior Publication Data
US 2012/0231563 A1    Sep. 13, 2012

Related U.S. Application Data

(62) Division of application No. 12/566,626, filed on Sep. 24, 2009, now Pat. No. 8,217,521.

(30) Foreign Application Priority Data

May 12, 2009    (TW) .............................. 98115709 A

(51) Int. Cl.
*H01L 21/66*    (2006.01)
*H01L 23/525*    (2006.01)
*H01L 23/48*    (2006.01)
*H01L 25/065*    (2006.01)

(52) U.S. Cl.
CPC .............. *H01L 23/525* (2013.01); *H01L 22/22* (2013.01); *H01L 23/481* (2013.01); *H01L 25/0657* (2013.01); *H01L 2225/06513* (2013.01); *H01L 2225/06541* (2013.01); *H01L 2224/16* (2013.01)
USPC .......................................................... 438/15

(58) Field of Classification Search
CPC ........... H01L 2924/01079; H01L 2924/01078; H01L 2924/01029; H01L 2924/01013; H01L 2924/14
USPC ......................... 438/15–16, 17, 612, 614, 617
See application file for complete search history.

(56) References Cited

U.S. PATENT DOCUMENTS

2009/0321957 A1 *    12/2009    Sasaki et al. .................. 257/777

* cited by examiner

*Primary Examiner* — (Vikki) Hoa B Trinh
(74) *Attorney, Agent, or Firm* — Jianq Chyun IP Office

(57) ABSTRACT

An operating method of a hardwired switch is provided. First, a first die is provided. The first die is configured as the first die in the hardwired switch. Next, a function of the first die is inspected to obtain an inspected result. Upon the inspected result, whether a second TSV is selectively disposed between the first landing pad and the fifth landing pad, between the second landing pad and the sixth landing pad, between the third landing pad and the seventh landing pad, or between the fourth landing pad and the eighth landing pad or not is determined. The first die is stacked above a second die, so that the second surface is located between the first die and the second die.

6 Claims, 12 Drawing Sheets

OPERATING METHOD OF HARDWIRED SWITCH

CROSS-REFERENCE TO RELATED APPLICATION

This application is a divisional application of and claims the priority benefit of U.S. application Ser. No. 12/566,626, filed on Sep. 24, 2009, now allowed, which claims the priority benefit of Taiwan application serial no. 98115709, filed on May 12, 2009. The entirety of each of the above-mentioned patent applications is hereby incorporated by reference herein and made a part of this specification.

BACKGROUND OF THE INVENTION

1. Field of the Invention

The present invention generally relates to an operating method of a hard switch, and more particularly, to and an operating method of a hard switch of a die stack.

2. Description of Related Art

With a progress in technology of die manufacturing, dies having different functions or differently processed are integrated by vertically stacking to deal with the issue in manufacturing transistors having different functions or differently processed in a single die. However, signal transmission paths in current die stacks are simply formed by configuring signal pads in redistribution layer (RDL) to change positions thereof in front or back of the dies. Next, the dies are connected through micro bumps therebetween in the die stack. Accordingly, signals are transmitted between the dies sequentially through wires, pads, micro bumps, and through silicon vias (TSVs) in a vertical direction thereof. Generally, due to the configuration in the above-described technology, signal transmission modes may be fixed between the dies in the stack. That is, when different designs of the signal transmission modes are required, the micro bumps or the wires configured in redistribution layer in front and back of the die need to be changed to satisfy the requirement.

SUMMARY OF THE INVENTION

One exemplary embodiment provides an operating method of a hardwired switch. By configuring through silicon vias (TSVs), the die stack having corresponding signal transmission modes is provided.

One exemplary embodiment provides an operating method of a hardwired switch. First, a first die is provided, wherein the first die is configured as the first die in the hardwired switch. Next, a function of the first die is inspected to obtain an inspected result. Upon the inspected result, whether a second TSV is selectively disposed between the first landing pad and the fifth landing pad, between the second landing pad and the sixth landing pad, between the third landing pad and the seventh landing pad, or between the fourth landing pad and the eighth landing pad or not is determined. The first die is stacked above a second die, so that the second surface is located between the first die and the second die.

In view of the above, the hardwired switch of the die stack in an exemplary embodiment adopts the different configurations of the TSVs to form the corresponding signal transmission mode of the die stack. While renewing design, the TSVs are re-configured without changing positions of bond pads on the die and positions of conductive bumps between the dies.

In order to make aforementioned and other objects, features and advantages of the present invention more comprehensible, preferred embodiments accompanied with figures are described in detail underneath. It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
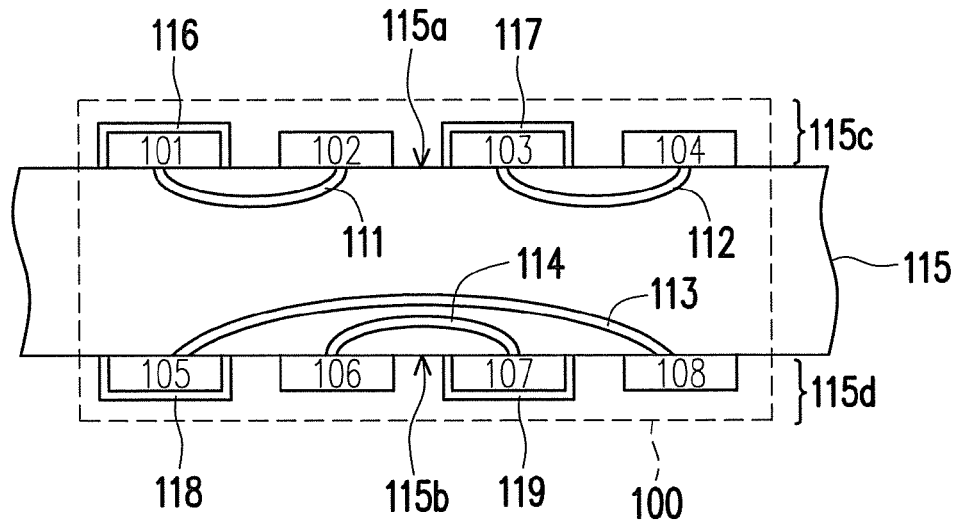
FIG. 1A is a schematic view of a hardwired switch of a die stack according to an exemplary embodiment consistent with the present invention.
Figure 1B:
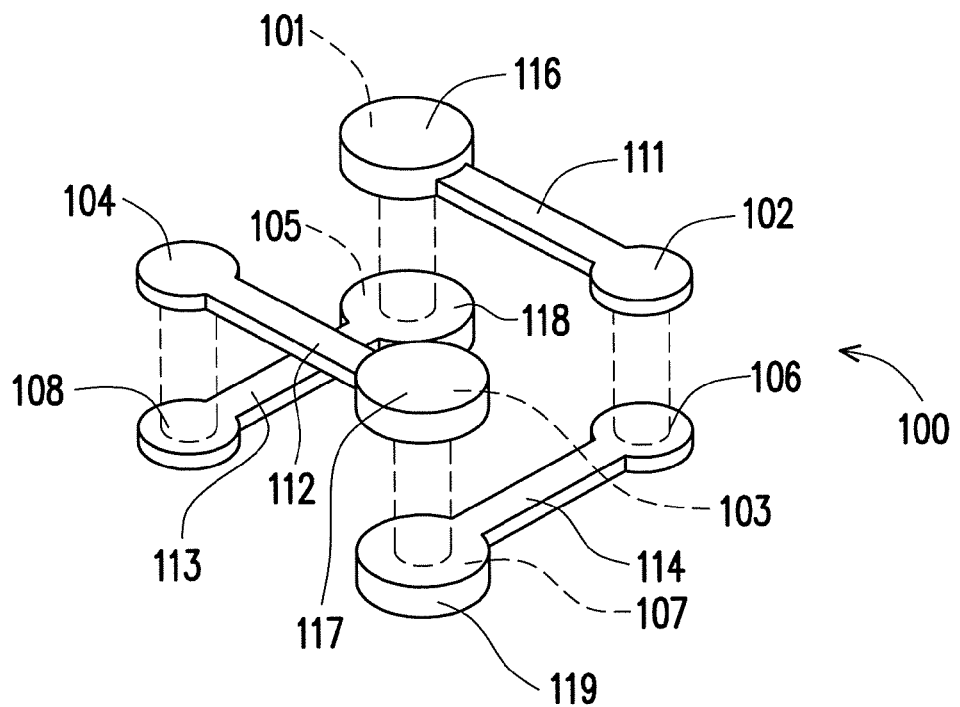
FIG. 1B is a partially enlarged three-dimensional schematic view of the hardwired switch of the die stack shown in FIG. 1A.

FIG. 1A is a schematic view of a hardwired switch of a die stack according to an exemplary embodiment consistent with the present invention. FIG. 1B is a partially enlarged three-dimensional schematic view of the hardwired switch of the die stack shown in FIG. 1A. Referring to FIG. 1A and FIG. 1B, the hardwired switch 100 of the die stack of the present embodiment includes landing pads 101-108.

The first landing pad 101 is disposed on a first surface 115$a$ of a first die 115. The second landing pad 102 is disposed on the surface 115$a$ and electrically connected to the landing pad 101. The third landing pad 103 is disposed on the surface 115$a$. The fourth landing pad 104 is disposed on the surface 115$a$ and electrically connected to the landing pad 103. The fifth landing pad 105 is disposed on a second surface 115$b$, wherein the landing pad 101 and the landing pad 105 partially or fully overlap in a vertical direction of the die 115, and FIG. 1A shows an example of fully overlapping. The sixth landing pad 106 is disposed on the surface 115$b$, wherein the landing pad 102 and the landing pad 106 partially or fully overlap in the vertical direction of the die 115, and FIG. 1A shows the example of fully overlapping. The seventh landing pad 107 is disposed on the surface 115$b$ and electrically connected to the landing pad 106, wherein the landing pad 103 and the landing pad 107 partially or fully overlap in the vertical direction of the die 115, and FIG. 1A shows the example of fully overlapping. The seventh landing pad 108 is disposed on the surface 115b and electrically connected to the landing pad 105, wherein the landing pad 104 and the landing pad 108 partially or fully overlap in the vertical direction of the die 115, and FIG. 1A shows the example of fully overlapping.

Specifically, the hardwired switch 100 of the die stack includes conducting wires 111-114 and bond pads 116-119. The first conducting wire 111 and the second conducting wire 112 are disposed on the surface 115a and respectively used to conduct the landing pads 101 and 102 and the landing pads 103 and 104. The third conducting wire 113 and the fourth conducting wire 114 are disposed on the surface 115b and respectively used to conduct the landing pads 105 and 108 and the landing pads 106 and 107. In the exemplary embodiment shown in FIG. 1A, the bond pads 116 and 117 respectively corresponds to the landing pads 101 and 103, and the bond pads 118 and 119 respectively corresponds to the landing pads 105 and 107. However, the description of the exemplary embodiment consistent with the present invention is not limited to this. For example, compared with the configuration shown in FIG. 1A, the bond pads 118 and 119 may respectively correspond to the landing pads 108 and 106.

FIG. 1A, the die 115 has a first redistribution layer (RDL) 115c and a second RDL 115d respectively at two sides thereof, and the surface 115a and 115b are respectively located in the RDL 115c and 115d. Accordingly, the conducting wires 111 and 112 and the landing pads 101-104 are disposed in the RDL 115c of the die 115, and the conducting wires 113 and 114 and the landing pads 105-108, for example, are disposed in the RDL 115d of the die 115.

Wherein, the conducting wires 111-114 may adopt different layouts in the vertical direction of the die 115 to form corresponding signal transmission routes. For example, in the vertical direction of the die 115, an angle of the conducting wires 111 and 114 may be any angle except for 180 degrees or 90 degrees. Furthermore, the conducting wires 112 and 114 may be disposed in the vertical direction of the die 115 according to the above layouts. Moreover, in the vertical direction of the die 115, the conducting wire 111 may be perpendicular to the conducting wire 113, the conducting wire 112 may be perpendicular to the conducting wire 113, and the conducting wire 112 may be perpendicular to the conducting wire 114.

Figure 1C:
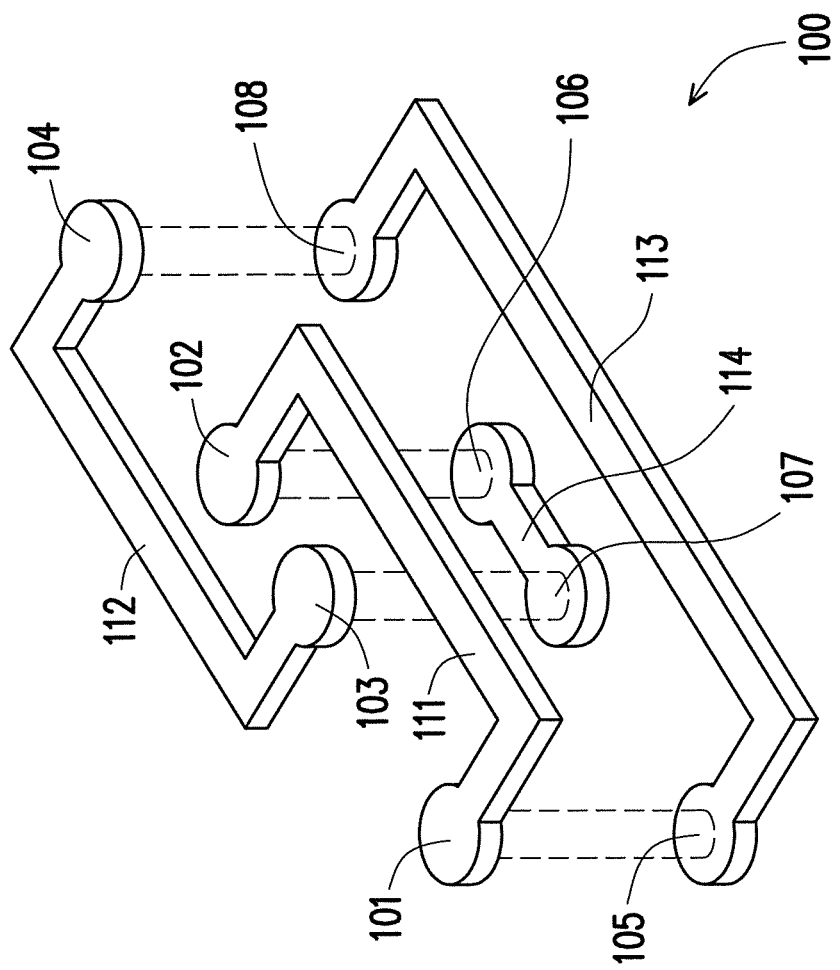
FIG. 1C is a partially enlarged three-dimensional schematic view of a hardwired switch of a die stack according to another exemplary embodiment consistent with the present invention.

Besides the partially enlarged three-dimensional schematic view shown in FIG. 1B, the hardwired switch of the die stack 100 may adopt other layouts. FIG. 1C is a partially enlarged three-dimensional schematic view of a hardwired switch of a die stack according to another exemplary embodiment consistent with the present invention. Referring to FIG. 1C, the landing pads 101-104 at the upper side of the die 115, i.e. the surface 115a, and the landing pads 105-108 at the lower side of the die 115, i.e. the surface 115b, both adopt a straight line layout. The conducting wire 111 may be curved round the landing pad 103 in a bending layout, the conducting wire 112 may be curved round the landing pad 102 in the bending layout, and the conducting wire 113 may be curved round the landing pads 106 and 107 in the bending layout. Moreover, in other exemplary embodiments (not shown), the landing pads 101-104 may be disposed in other suitable layouts at the upper side of the die 115, and the landing pads 105-108 may be disposed in other suitable layouts at the lower side of the die 115. The relative angles and positions of the conducting wires 111-114 may be correspondingly adjusted according to the configuration of the landing pads 101-108. The description of the exemplary embodiment consistent with the present invention is not limited to this.

Furthermore, referring to FIG. 1B, the bond pads 116-119 are respectively disposed corresponding to the landing pads 101, 103, 105, and 107, wherein the bond pads 116-119 are respectively electrically connected to the landing pads 101, 103, 105, and 107, so as to facilitate conduction with an external electronic element. In the exemplary embodiment, the bond pads 116-119 may be disposed as shown in FIG. 1B to respectively cover the landing pads 101, 103, 105, and 107. It should be noted that, the configuration of the bond pads is not limited in the description of the exemplary embodiment consistent with the present invention. Compared with FIG. 1B, in which the third bond pad 118 and the fourth bond pad 119 are respectively disposed corresponding to the landing pads 105 and 107, the bond pads 118 and 119 respectively cover the landing pads 108 and 107, so as to facilitate conduction with an external electronic element in other exemplary embodiments (not shown).

Figure 1D:
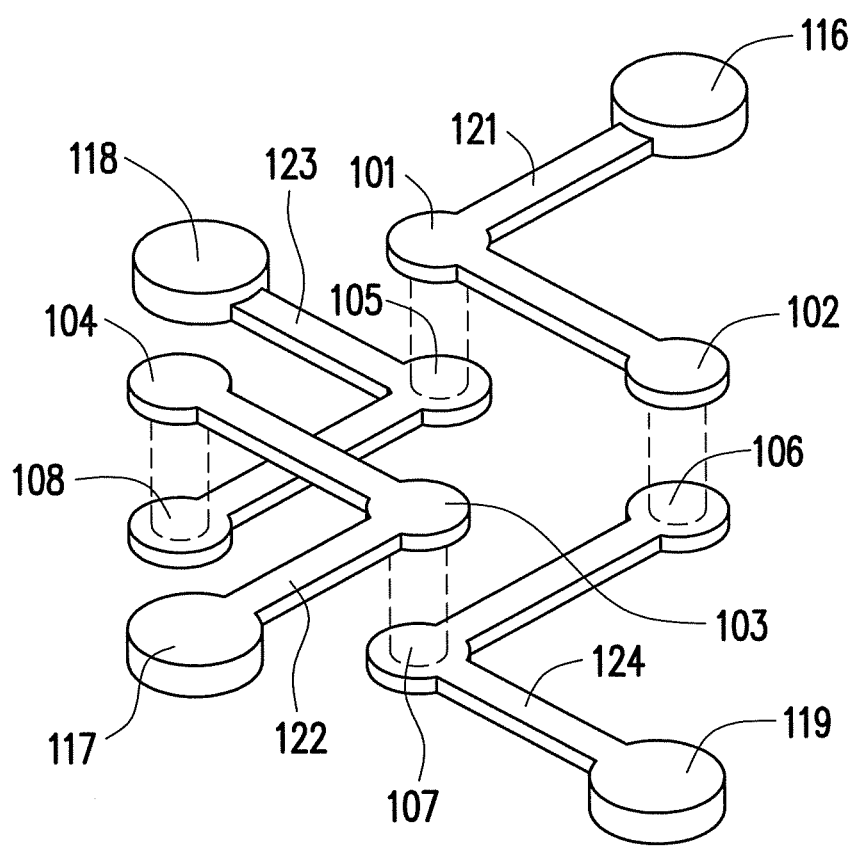
FIG. 1D is a partially enlarged three-dimensional schematic view of a hardwired switch of a die stack according to another exemplary embodiment consistent with the present invention.

FIG. 1D is a partially enlarged three-dimensional schematic view of a hardwired switch of a die stack according to another exemplary embodiment consistent with the present invention. Referring to FIG. 1D, compared with FIG. 1B, in which the bond pads 116-119 respectively cover the landing pads 101, 103, 105, and 107, in the exemplary embodiment, the bond pads 116-119 does not cover the landing pads 108 and 107 and are respectively electrically connected to the landing pads 101, 103, 105, and 107 through conducting wires 121-124.

In all of the above-described embodiments, through silicon vias (TSVs) are selectively formed between the landing pads 101 and 105, between the landing pads 102 and 106, between the landing pads 103 and 107, and between the landing pads 104 and 108, so that corresponding signal transmission modes are generated. In following, it will be further described with reference to FIG. 3A through FIG. 3F.

Figure 3A:
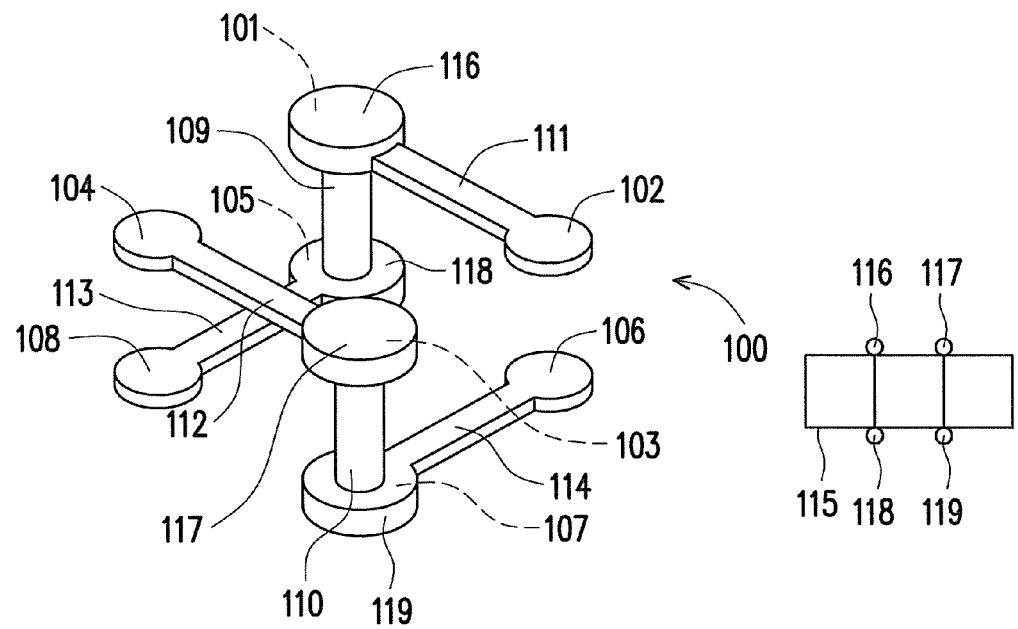
FIG. 3A through FIG. 3F are partially enlarged three-dimensional schematic views of hardwired switches of die stacks according to exemplary embodiments consistent with the present invention.

FIG. 3A through FIG. 3F are partially enlarged three-dimensional schematic views of hardwired switches of die stacks according to exemplary embodiments consistent with the present invention. Referring to FIG. 3A, a first TSV 109 exists between the landing pads 101 and 105, and a second TSV 110 exists between the landing pads 103 and 107. Accordingly, the bond pad 116, the landing pad 101, the TSV 109, the landing pad 105, and the bond pad 118 form one signal transmission path, and the bond pad 117, the landing pad 103, the TSV 110, the landing pad 107, and the bond pad 119 form another signal transmission path. As a result, the signal from the bond pad 116 is transmitted to the bond pad 118, and the signal from the bond pad 117 is transmitted to the bond pad 119. This kind of the configuration, in which the signals are directly transmitted, is a through mode.

Figure 3B:
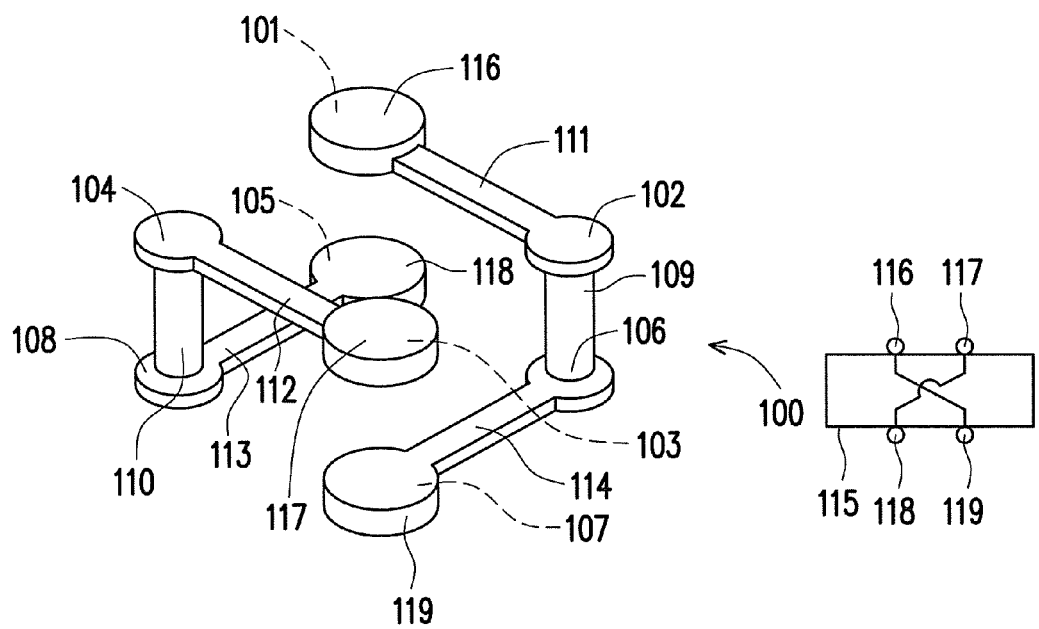

Referring to FIG. 3B, the TSV 109 exists between the landing pads 102 and 106, and the TSV 110 exists between the landing pads 104 and 108. Accordingly, the bond pad 116, the landing pad 101, the conducting wire 111, the landing pad 102, the TSV 109, the landing pad 106, the conducting wire 114, the landing pad 107, and the bond pad 119 form one signal transmission path, and the bond pad 117, the landing pad 103, the conducting wire 112, the landing pad 104, the TSV 110, the landing pad 108, the conducting wire 113, the landing pad 105, and the bond pad 118 form another signal transmission path. As a result, the signal from the bond pad 116 is transmitted to the bond pad 119, and the signal from the bond pad 117 is transmitted to the bond pad 118. This kind of the configuration, in which the signals are crisscross transmitted, is a cross mode.

Figure 3C:
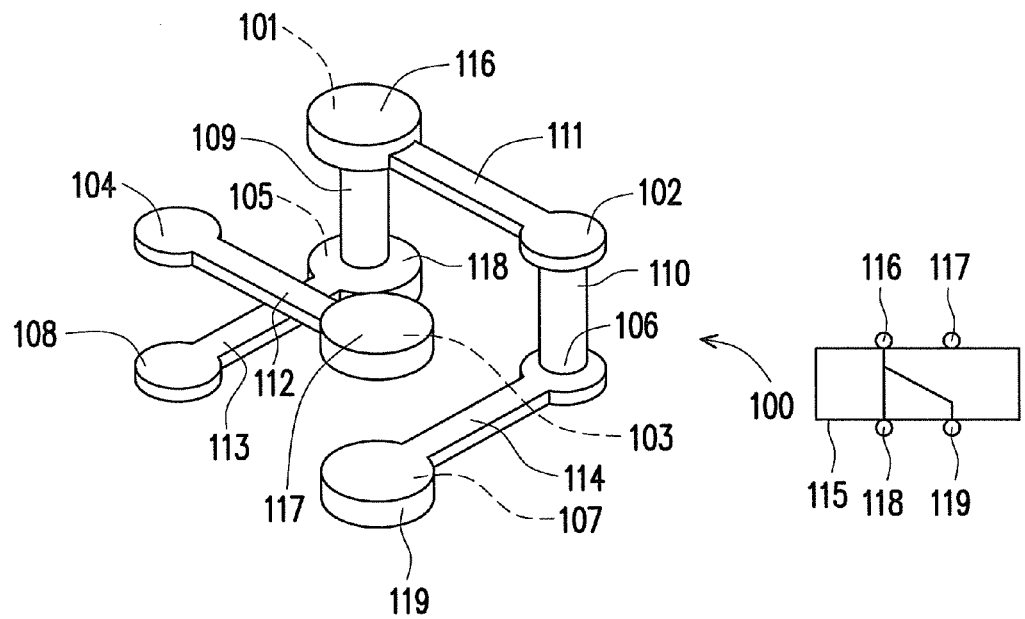

Referring to FIG. 3C, the TSV 109 exists between the landing pads 101 and 105, and the TSV 110 exists between the landing pads 102 and 106. Accordingly, the bond pad 116, the landing pad 101, the conducting wire 111, the landing pad 102, the TSV 110, the landing pad 106, the conducting wire 114, the landing pad 107, and the bond pad 119 form one signal transmission path, and the bond pad 116, the landing pad 101, the TSV 109, the landing pad 105, and the bond pad 118 form another signal transmission path. As a result, the signal from the bond pad 116 is transmitted to the bond pads 118 and 119. This kind of the configuration, in which the signals are transmitted from a single bond pad on the upper layer to two bond pads on the lower layer, is a left down cast mode.

Figure 3D:
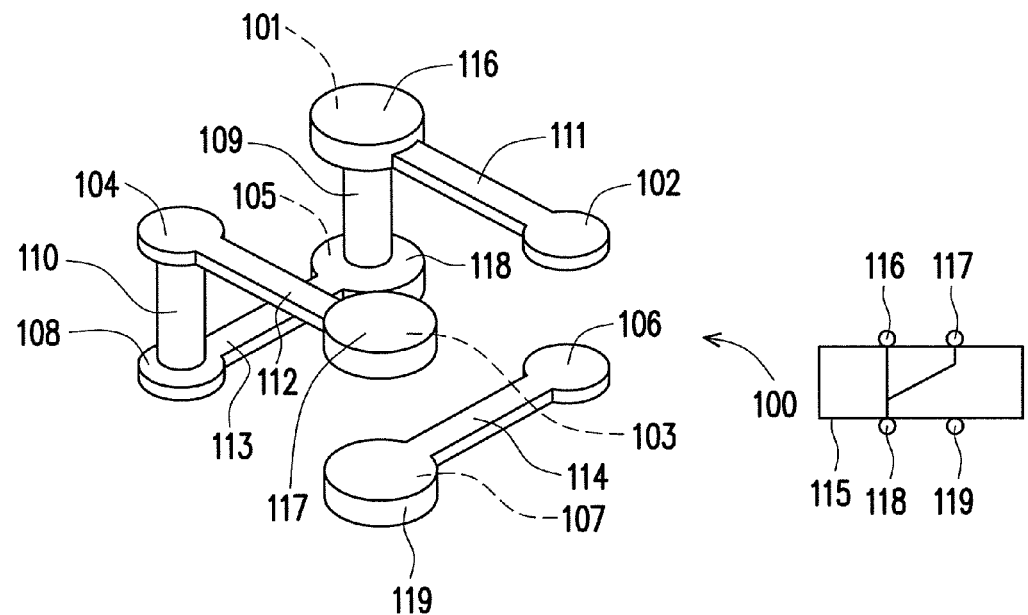

Referring to FIG. 3D, the TSV 109 exists between the landing pads 101 and 105, and the TSV 110 exists between the landing pads 104 and 108. Accordingly, the bond pad 118, the landing pad 105, the conducting wire 113, the landing pad 108, the TSV 110, the landing pad 104, the conducting wire 112, the landing pad 103, and the bond pad 117 form one signal transmission path, and the bond pad 118, the landing pad 105, the TSV 109, the landing pad 101, and the bond pad 116 form another signal transmission path. As a result, the signal from the bond pad 118 is transmitted to the bond pads 116 and 117. This kind of the configuration, in which the signals are transmitted from a single bond pad on the lower layer to two bond pads on the upper layer, is a left up cast mode.

Figure 3E:
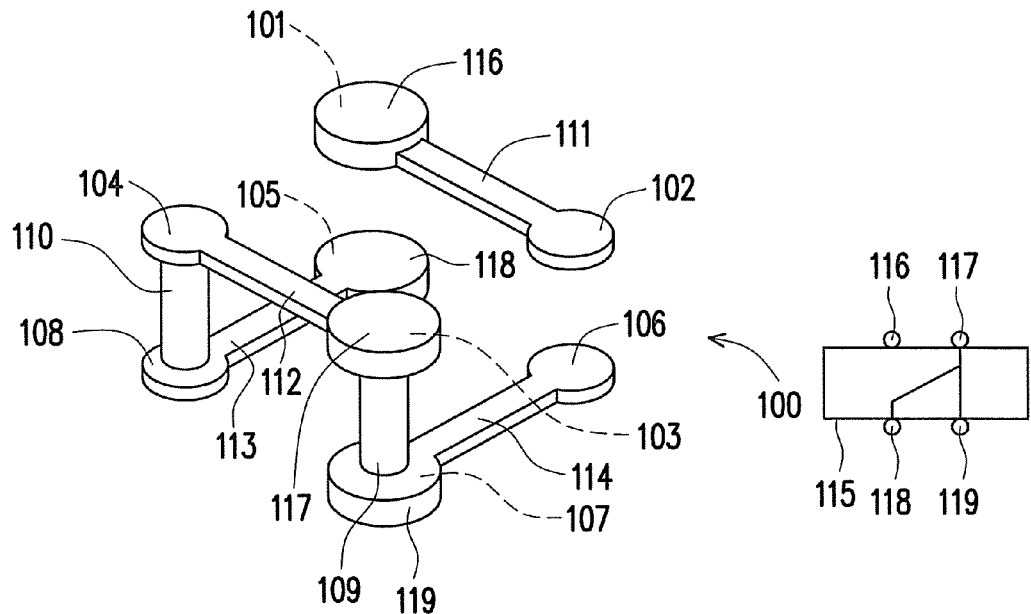

Referring to FIG. 3E, the TSV 109 exists between the landing pads 103 and 107, and the TSV 110 exists between the landing pads 104 and 108. Accordingly, the bond pad 117, the landing pad 103, the conducting wire 112, the landing pad 104, the TSV 110, the landing pad 108, the conducting wire 113, the landing pad 105, and the bond pad 118 form one signal transmission path, and the bond pad 117, the landing pad 103, the TSV 109, the landing pad 107, and the bond pad 119 form another signal transmission path. As a result, the signal from the bond pad 117 is transmitted to the bond pads 118 and 119. This kind of the configuration, in which the signals are transmitted from a single bond pad on the upper layer to two bond pads on the lower layer, is a right down cast mode.

Figure 3F:
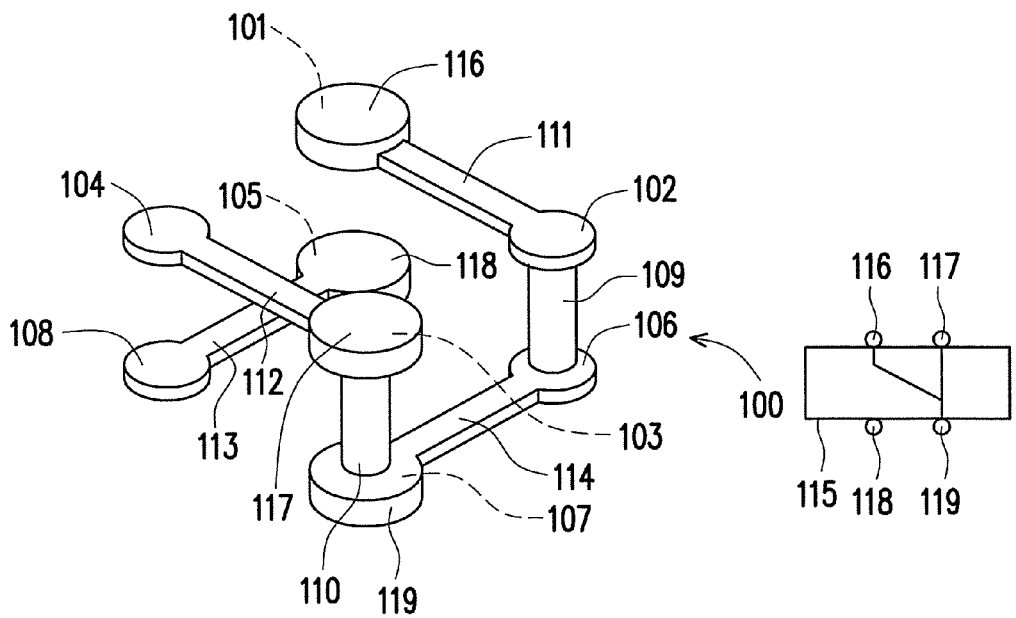

Referring to FIG. 3F, the TSV 109 exists between the landing pads 102 and 106, and the TSV 110 exists between the landing pads 103 and 107. Accordingly, the bond pad 119, the landing pad 107, the conducting wire 114, the landing pad 106, the TSV 109, the landing pad 102, the conducting wire 111, the landing pad 101, and the bond pad 116 form one signal transmission path, and the bond pad 119, the landing pad 107, the TSV 110, the landing pad 103, and the bond pad 117 form another signal transmission path. As a result, the signal from the bond pad 119 is transmitted to the bond pads 116 and 117. This kind of the configuration, in which the signals are transmitted from a single bond pad on the lower layer to two bond pads on the upper layer, is a right up cast mode.

Figure 2:
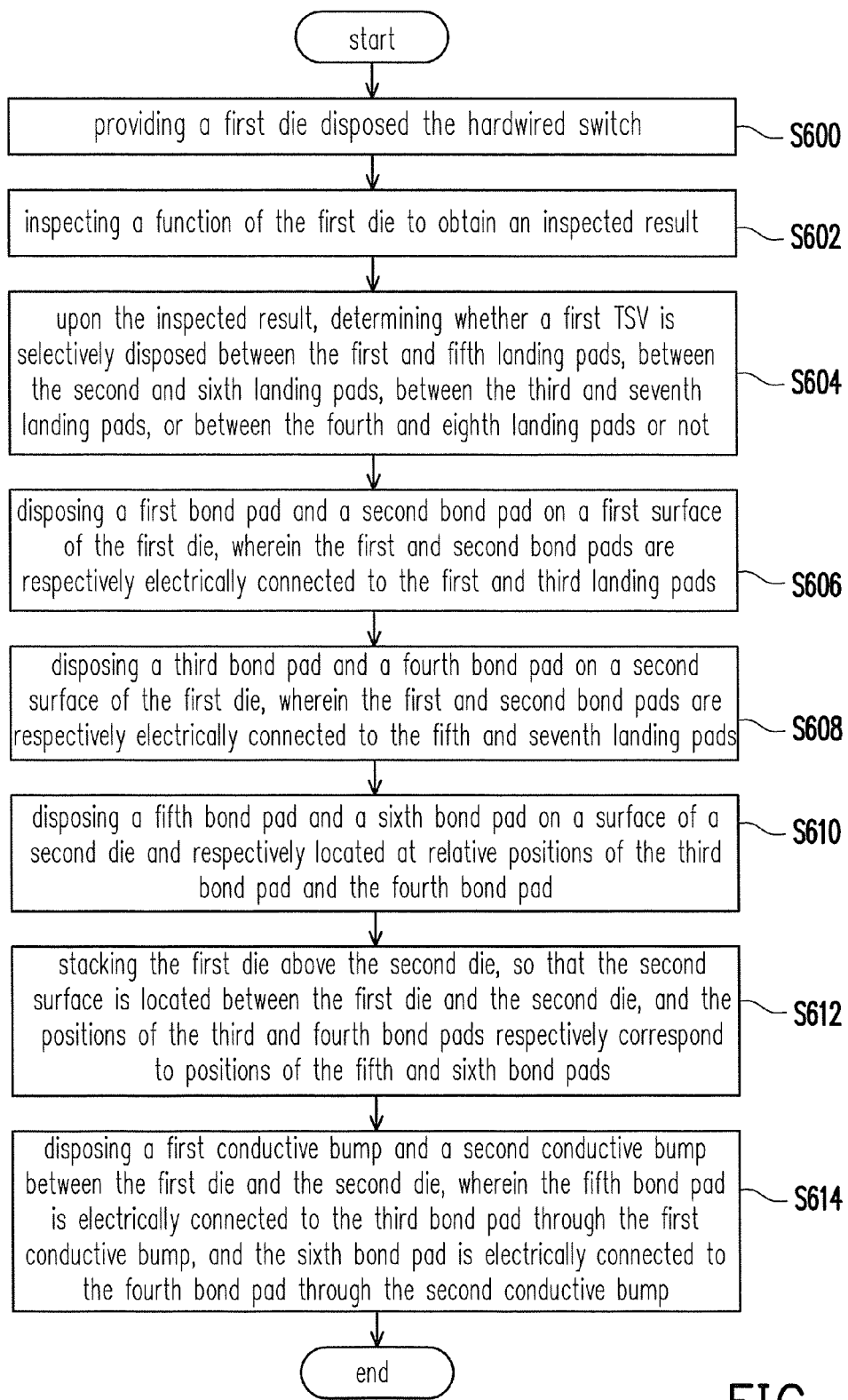
FIG. 2 is a flow chart of an operating method of a hardwired switch according to an exemplary embodiment consistent with the present invention.

Since there are two TSVs disposed in each of the above-described modes, the hardwired switches to which one of the above-described modes is applied are so-called "Dual-TSV Hardwired Switches" (DTHS). Besides the above-described through mode, cross mode, left down cast mode, right down cast mode, and right up cast mode, in other embodiments (not shown), there may be a single TSV, three TSVs, or four TSVs disposed on the die at the same time, so that other signal transmission modes are correspondingly formed. Furthermore, there may be no TSV disposed on the die as shown in FIG. 1B, so that the two sides of the die are not conducted to each other. Moreover, users may inspect a function of the die to obtain an inspected result and further operate the hardwired switch according thereto. That is, different configurations of TSVs corresponding to different signal transmission modes are provided according to the inspected result. FIG. 2 is a flow chart of an operating method of a hardwired switch according to an exemplary embodiment consistent with the present invention. Referring to FIG. 2, first, a first die in which the hardwired switch is disposed is provided in step S600, wherein the above-described hardwired switch, for example, is the hardwired switch 100 as shown in FIG. 1A. Next, a function of the first die is inspected to obtain an inspected result in step S602. Upon the inspected result, whether a first TSV is selectively disposed between the first landing pad 101 and the fifth landing pad 105, between the second landing pad 102 and the sixth landing pad 106, between the third landing pad 103 and the seventh landing pad 107, or between the fourth landing pad 104 and the eighth landing pad 108 or not is determined in step S604. In other embodiments, whether a second TSV is selectively disposed in the hardwired switch 100 or not is further determined. The configuration of the TSVs of the hardwired switch 100 inside the first die is determined in step S604. The signal transmission mode corresponding to the above-described configuration may be one of the through mode, the cross mode, the left down cast mode, the right down cast mode, and the right up cast mode as respectively shown in FIG. 3A through FIG. 3F or one of other signal transmission modes.

A first bond pad and a second bond pad are disposed on a first surface of the first die, wherein the first bond pad and the second bond are respectively electrically connected to the first landing pad 101 and the third landing pad 103 in step S606. A third bond pad and a fourth bond pad are disposed on a second surface of the first die, wherein the first bond pad and the second bond are respectively electrically connected to the fifth landing pad 105 and the seventh landing pad 107 in step S608. In another embodiment, the first bond pad and the second bond may be respectively electrically connected to the sixth landing pad 106 and the eighth landing pad 108 in step S608.

A fifth bond pad and a sixth bond pad are respectively disposed on a surface of a second die and respectively located at relative positions of the third bond pad and the fourth bond pad in step S610. The first die is stacked above the second die, so that the second surface is located between the first die and the second die, and the positions of the third bond pad and the fourth bond pad respectively correspond to positions of the fifth bond pad and the sixth bond pad in step S612. A first conductive bump and a second conductive bump are disposed between the first die and the second die, wherein the fifth bond pad is electrically connected to the third bond pad through the first conductive bump, and the sixth bond pad is electrically connected to the fourth bond pad through the second conductive bump in step S614.

Exemplary embodiments of the operating methods of the hardwired switches are provided as follows to illustrate in detail respectively with reference to FIG. 4A and FIG. 4B, FIG. 5A through FIG. 5C, and FIG. 6A through FIG. 6D. FIG. 4A and FIG. 4B, FIG. 5A through FIG. 5C, and FIG. 6A through FIG. 6D simply illustrate the operating methods of the hardwired switch 100 respectively. The configurations of the TSVs thereof refer to FIG. 3A through FIG. 3F, so that detailed descriptions are not repeated herein.

Figure 4A:
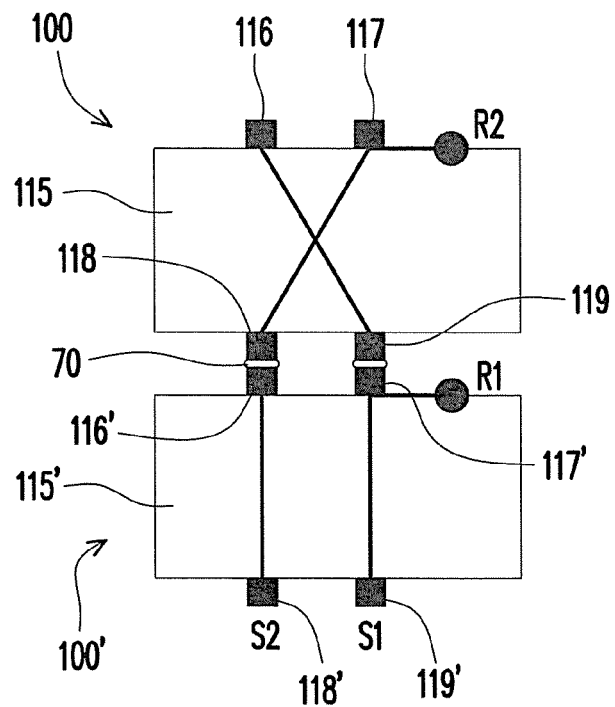
FIG. 4A and FIG. 4B are schematic views of the operating methods of a hardwired switch according to an exemplary embodiment consistent with the present invention.
Figure 4B:
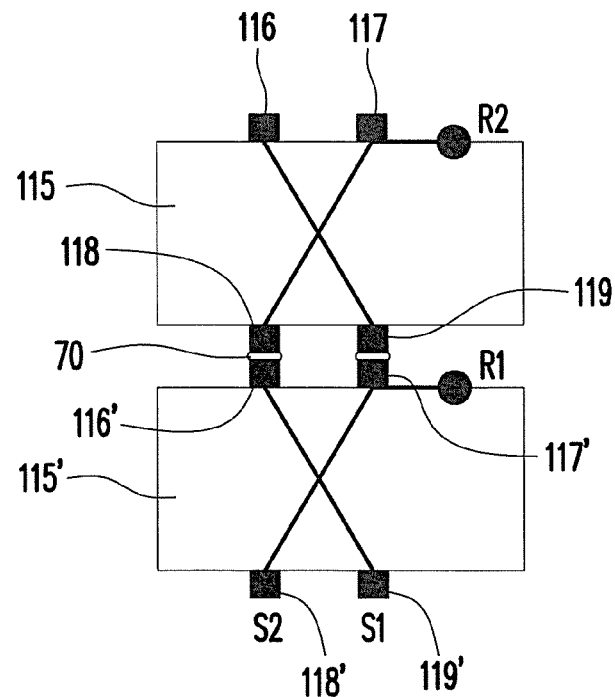

FIG. 4A and FIG. 4B are schematic views of the operating methods of a hardwired switch according to an exemplary embodiment consistent with the present invention. Referring to FIG. 4A, the first die 115 and the second die 115' respectively have the above-described hardwired switches 100 and 100', and the first die 115 is stacked on the first die 115'. In the hardwired switch 100 of the first die 115, the configuration of the TSVs thereof is shown as FIG. 3B, so that the hardwired switch 100 is operated in the cross mode. In the hardwired switch 100' of the first die 115', the configuration of the TSVs thereof is shown as FIG. 3A, so that the hardwired switch 100' is operated in the through mode. A conductive bump 70 is located between the die 115 and 115', so that the bond pads 118 and 119 of the die 115 are respectively electrically connected to the bond pads 116' and 117' of the die 115'. In the configuration, a signal S1 is transmitted to a signal receiving point R1 located on the die 115' sequentially through the bond pads 119' and 117', and a signal S2 is transmitted to a signal receiving point R2 located on the die 115 sequentially through the bond pads 118', 116', 118, and 117.

Referring to FIG. 4B, for some reasons, such as the signal S1 being determined and selected to the die 115 having a relatively fast and steady transmission speed according to the inspecting result, the signals S1 and S2 have to be respectively transmitted to the signal receiving point R2 located on the die 115 and the signal receiving point R1 located on the die 115'. Accordingly, the signal transmission mode of the die 115' is changed to the above-described cross mode by changing the configuration of the TSVs in the die 115'. In other words, the conductive bump 70 and the circuit layout on the surface of the die are not changed, but the signal transmission mode thereof is changed by changing the configuration of the TSVs in the die.

Figure 5A:
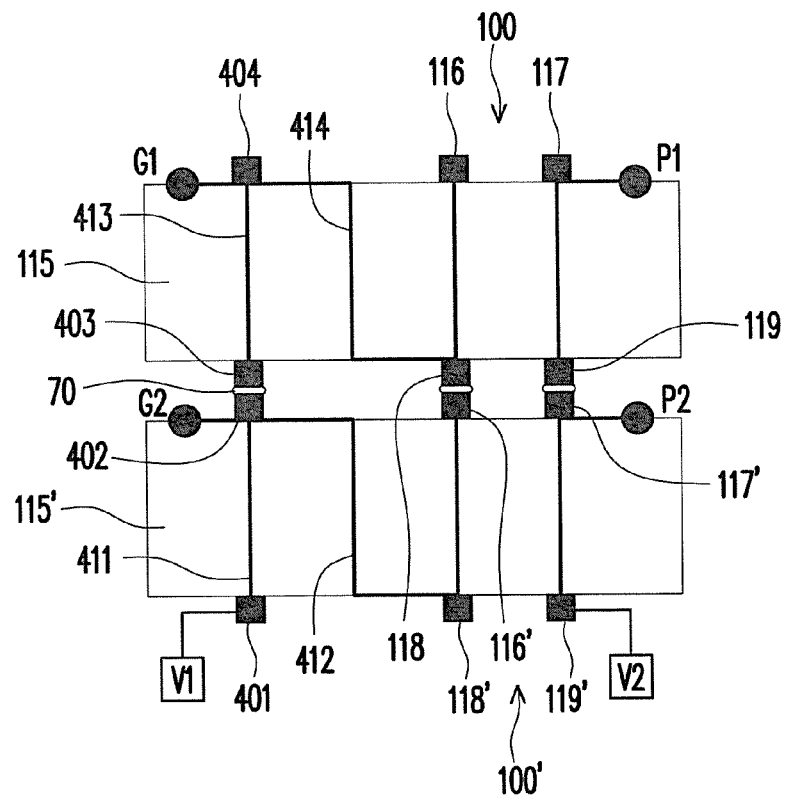
FIG. 5A through FIG. 5C are schematic views of the operating methods of a hardwired switch according to an exemplary embodiment consistent with the present invention.
Figure 5B:
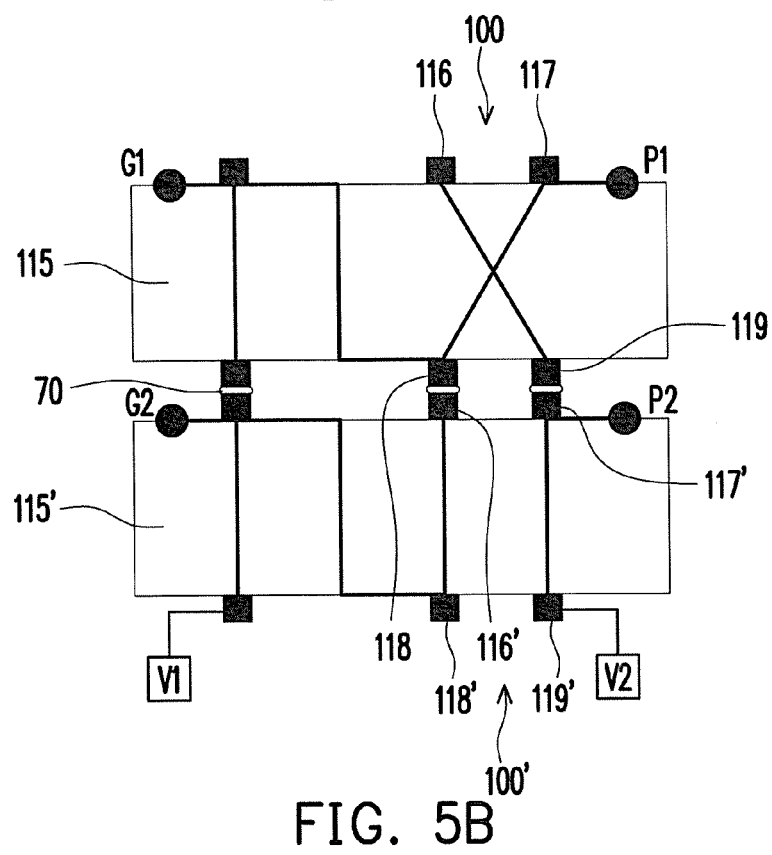
Figure 5C:
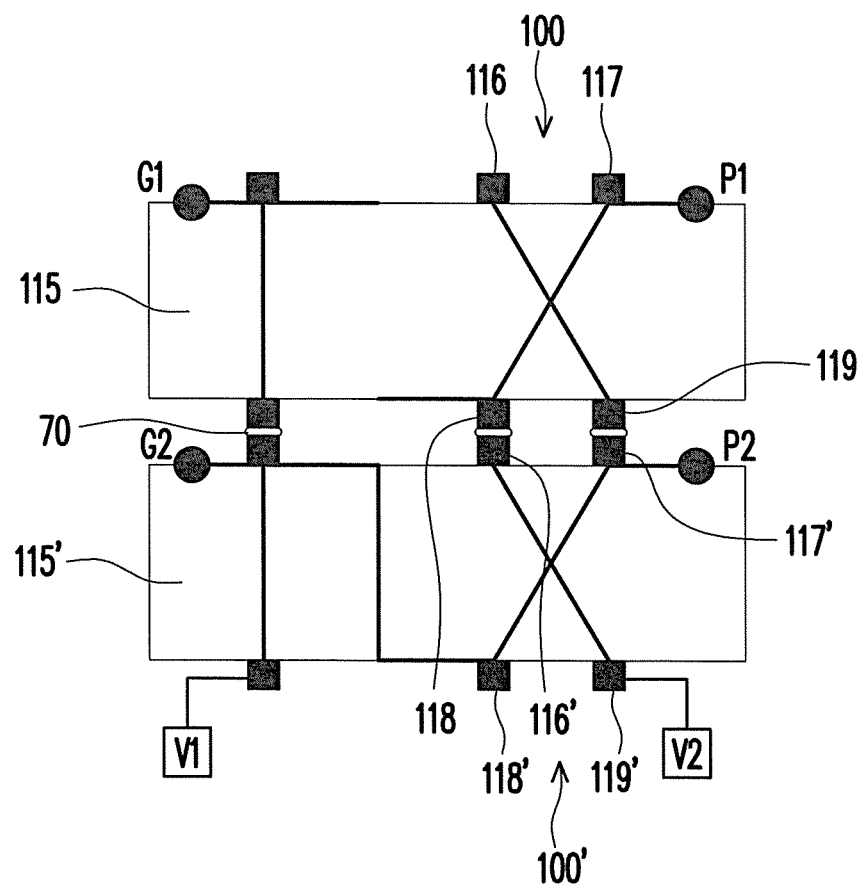

FIG. 5A through FIG. 5C are schematic views of the operating methods of a hardwired switch according to another exemplary embodiment consistent with the present invention. Referring to FIG. 5A, the conductive bump 70 is located between the die 115 and 115', so that the bond pads 118 and 119 of the die 115 are respectively electrically connected to the bond pads 116' and 117' of the die 115'. A voltage source V1, such as a ground voltage VSS, and a voltage source V2, such as a system voltage VDD, are respectively electrically connected to the bond pads 401 and 119' of the die 115'. The voltage source V1 provides the ground voltage VSS to a ground end G2 of the die 115' through the bond pad 401, the TSV 411, and the bond pad 402 and further to a ground end G1 of the die 115 through the conductive bump 70, the bond pad 403, the TSV 413, and the bond pad 404. Wherein, the bond pad 118' is connected to the bond pad 402 through the TSV 412, and the bond pad 118 is connected to the bond pad 404 through the TSV 414.

Herein, suppose that the die 115' and the die 115 stacked thereon are both good dies in the inspecting result of the function of the die. Accordingly, the TSVs in the hardwired switch 100 of the die 115 are configured as the configuration of the TSVs shown as FIG. 3A, and the TSVs in the hardwired switch 100' of the die 115' are also configured as the configuration of the TSVs shown as FIG. 3A, so that the hardwired switches 100 and 100' are both operated in the through mode. The voltage source V2 provides the system voltage VDD to a power end P2 of the die 115' through the bond pads 119' and 117' and further to a power end P1 of the die 115 through the conductive bump 70 and the bond pads 119 and 117. Meanwhile, the power end P1 and the ground end G1 of the die 115 are respectively conducted to the voltage sources V2 and V1, and the power end P2 and the ground end G2 of the die 115' are respectively conducted to the voltage sources V2 and V1, so that the dies 115 and 115' are both normally operated at the same time.

Referring to FIG. 5B, when the die 115 is determined to a bad die, but the die 115' is determined to a good die upon the inspecting result of the function of the die, the hardwired switch 100 of the die 115 is operated in the cross mode as shown in FIG. 3B by changing the configuration of the TSVs thereof. The voltage source V2 provides the system voltage VDD to the power end P2 of the die 115' through the bond pads 119' and 117' but not to the power end P1 of the die 115. Meanwhile, the power end P1 and the ground end G1 of the die 115 are both coupled to the voltage source V1, so that the die 115 is turned off or disable because of no system voltage VDD. The power end P2 and the ground end G2 of the die 115' are still conducted to the voltage sources V2 and V1 respectively. Accordingly, the die 115' is still operated not ally. In other words, the conductive bump 70 and the circuit layout on the surface of the die are not changed, but the specific die is turned off by changing the configuration of the TSVs in the die.

Furthermore, referring to FIG. 5C, when the die 115 is determined to a good die, but the die 115' is determined to a bad die upon the inspecting result of the function of the die, the hardwired switch 100 of the die 115 and the hardwired switch 100' of the die 115' are both operated in the cross mode as shown in FIG. 3B by changing the configurations of the TSVs thereof, and there is no TSV disposed in the die 115. Accordingly, the voltage source V2 provides the system voltage VDD to the power end P1 of the die 115 through the bond pads 119' and 116', the conductive bump 70, and the bond pads 117 and 118 but not to the power end P2 of the die 115'. Meanwhile, the power end P2 and the ground end G2 of the die 115' are both coupled to the voltage source V1, so that the die 115' is turned off or disable because of no system voltage VDD. The power end P1 and the ground end G1 of the die 115 are still conducted to the voltage sources V2 and V1 respectively. Accordingly, the die 115 is still operated normally. In other words, the conductive bump 70 and the circuit layout on the surface of the die are not changed, but the specific die is turned off by changing the configuration of the TSVs in the die.

FIG. 6A through FIG. 6D are schematic views of the operating methods of a hardwired switch according to another exemplary embodiment consistent with the present invention. The operating method of the hardwired switch applied to a die stack having double layer is described in the exemplary embodiment. In the present embodiment, the bond pads 116 and 117 of the upper die 115 are respectively connected to different circuit blocks C1 and C2. Due to the different signal transmission modes of the hardwired switch 100 of the die 115 and the hardwired switch 100' of the die 115', the signal S1 from the bond pad 118' and the signal S2 from the bond pad 119' are respectively transmitted to the circuit block C1 and/or the circuit block C2 through different paths. For understanding, suppose that each of the signals S1 and S2 represents a clock signal having a corresponding frequency, and the circuit blocks C1 and C2 are limited to different operating speed due to the variation of the process.

Figure 6A:
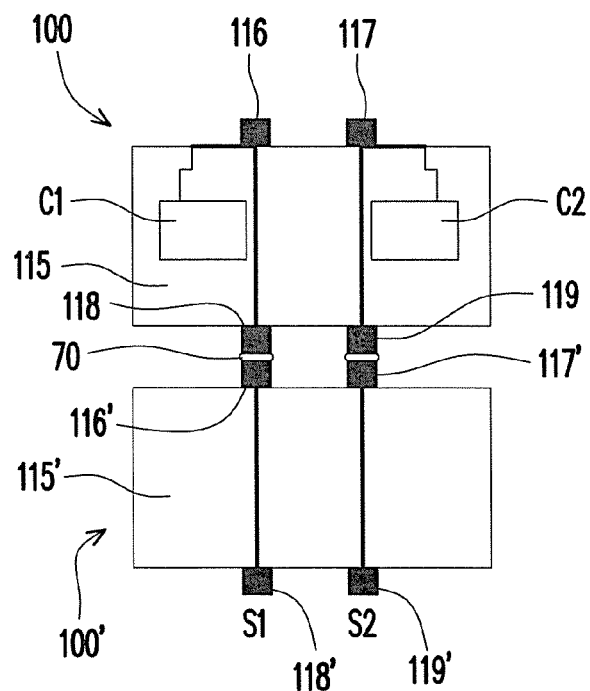
FIG. 6A through FIG. 6D are schematic views of the operating methods of a hardwired switch according to an exemplary embodiment consistent with the present invention.

Herein, suppose that the circuit block C1 can be operated at a high speed clock, but the circuit block C2 is simply operated at a low speed clock in the inspecting result of the function of the die. Referring to FIG. 6A, in the dies 115' and 115 stacked thereon, the TSVs in the hardwired switches 100 and 110' are configured as the configuration of the TSVs shown as FIG. 3A, so that the hardwired switches 100 and 100' are both operated in the through mode. Moreover, the corresponding bond pads are respectively electrically connected through the conductive bump 70 located between the dies 115 and 115'. Accordingly, the signal S1 representing the high speed clock signal is transmitted to the circuit block C1 through the bond pads 118' and 116', the conductive bump 70, and the bond pads 118 and 116. The signal S2 representing the low speed clock signal is transmitted to the circuit block C2 through the bond pads 119' and 117', the conductive bump 70, and the bond pads 119 and 117.

Figure 6B:
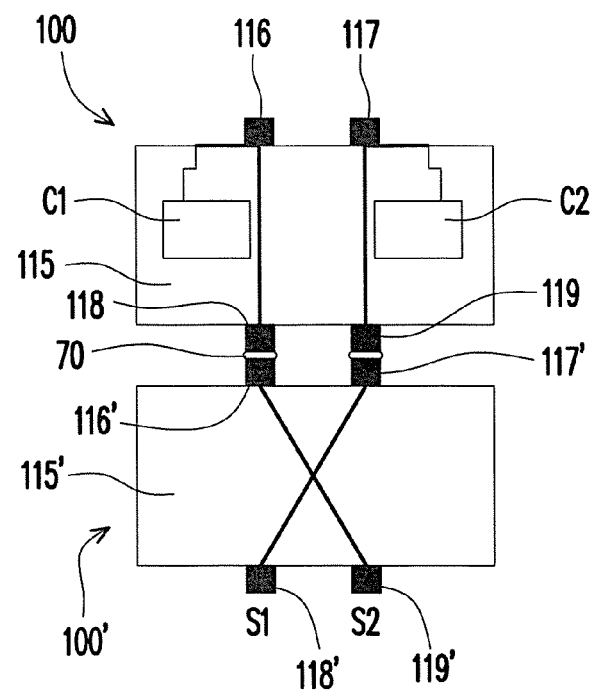

Next, suppose that the circuit block C1 is simply operated at the low speed clock, but the circuit block C2 can be operated at the high speed clock in the inspecting result of the function of the die. Referring to FIG. 6B, compared with FIG. 6A, the configuration of the TSVs in the hardwired switch 100' of the first die 115' is configured as the configuration of the TSVs shown in FIG. 3B, so that the hardwired switch 100' is operated in the cross mode. Accordingly, the signal S1 representing the high speed clock signal is transmitted to the circuit block C2 through the bond pads 118' and 117', the conductive bump 70, and the bond pads 119 and 117. The signal S2 representing the low speed clock signal is transmitted to the circuit block C1 through the bond pads 119' and 116', the conductive bump 70, and the bond pads 118 and 116.

Figure 6C:
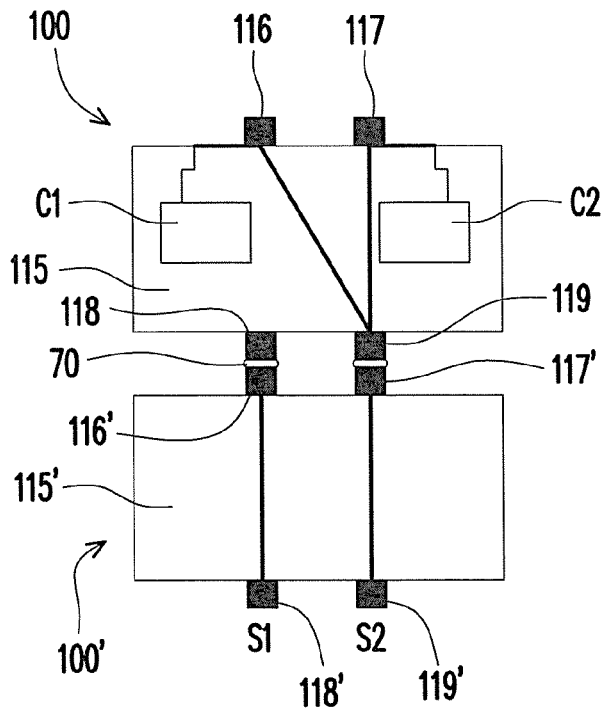

Next, suppose that the circuit blocks C1 and C2 are simply operated at the low speed clock in the inspecting result of the function of the die Referring to FIG. 6C, compared with FIG. 6A, the configuration of the TSVs in the hardwired switch 100 of the first die 115 is configured as the configuration of the TSVs shown in FIG. 3F, so that the hardwired switch 100 is operated in the right up cast mode. Accordingly, the signal S2 representing the low speed clock signal is transmitted to the circuit blocks C1 and C2 through the bond pads 119' and 117', the conductive bump 70, and the bond pads 119, 116, and 117.

Figure 6D:
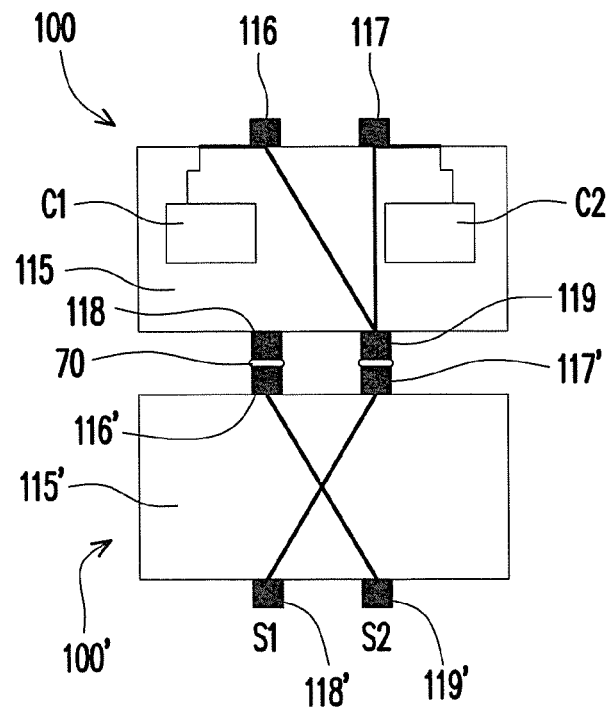

On the contrary, suppose that the circuit blocks C1 and C2 can be operated at the high speed clock in the inspecting result of the function of the die Referring to FIG. 6D, compared with FIG. 6C, the configuration of the TSVs in the hardwired switch 100' of the first die 115' is configured as the configuration of the TSVs shown in FIG. 3B, so that the hardwired switch 100' is operated in the cross mode. Accordingly, the signal S1 representing the high speed clock signal is transmitted to the circuit blocks C1 and C2 through the bond pads 118' and 117', the conductive bump 70, and the bond pads 119, 116, and 117. In other words, the conductive bump 70 and the circuit layout on the surface of the die are not changed, but the signal transmission mode thereof is changed by changing the configuration of the TSVs in the die.

The operating methods illustrated in FIG. 4A and FIG. 4B, FIG. 5A through FIG. 5C, and FIG. 6A through FIG. 6D are simply exemplary embodiments but not limit to the present invention. In other words, in other embodiments (not shown), there may be more than three dies in a die stack, and the configuration of the TSVs in each of the dies may be one of the through mode, the cross mode, the left down cast mode, the right down cast mode, and the right up cast mode or one of other signal transmission modes, so that the corresponding signal transmission paths are formed in the die stack.

In view of the above, through different configurations of the TSVs, the corresponding signal transmission modes are formed in the exemplary embodiments of the hardwired switches of the die stacks. In the die stack, the signals are transmitted through different signal transmission paths formed by the dies having different signal transmission modes. While renewing design, the TSVs are re-configured without changing the positions of the bond pads on the die and the positions of the conductive bumps between the dies.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An operating method of a hardwired switch, comprising:
providing a first die;
inspecting a function of the first die to obtain an inspected result;
determining whether a first through silicon via is selectively disposed between a first landing pad and a fifth landing pad, between a second landing pad and a sixth landing pad, between a third landing pad and a seventh landing pad, or between a fourth landing pad and a eighth landing pad or not upon the inspected result, wherein the first landing pad, the second landing pad, the third landing pad the fourth landing pad are disposed on a first surface of the first die, and the fifth landing pad, the sixth landing pad, the seventh landing pad and the eighth landing pad are disposed on a second surface of the first die;
disposing a third bond pad on the second surface, wherein the third bond pad is electrically connected to the fifth landing pad;
disposing a fourth bond pad on the second surface, wherein the fourth bond pad is electrically connected to the seventh landing pad;
disposing a fifth bond pad on a third surface of the second die, wherein the fifth bond pad is located at a relative position of the third bond pad;
disposing a sixth bond pad on the third surface, wherein the sixth bond pad is located at a relative position of the fourth bond pad; and
stacking the first die above the second die, so that the second surface and the third surface are located between the first die and the second die, wherein the fifth bond pad is electrically connected to the third bond pad, and the sixth bond pad is electrically connected to the fourth bond pad.

2. The operating method of the hardwired switch as claimed in claim 1, further comprising:
determining whether a second through silicon via is selectively disposed between the first landing pad and the fifth landing pad, between the second landing pad and the sixth landing pad, between the third landing pad and the seventh landing pad, or between the fourth landing pad and the eighth landing pad or not upon the inspected result.

3. The operating method of the hardwired switch as claimed in claim 1, wherein disposing the first landing pad, the second landing pad, the third landing pad, and the fourth landing pad in a first redistribution layer of the first die, and disposing the fifth landing pad, the sixth landing pad, the seventh landing pad, and the eighth landing pad in a second redistribution layer of the first die.

4. The operating method of the hardwired switch as claimed in claim 1, further comprising:
disposing a first bond pad on the first surface, wherein the first bond pad is electrically connected to the first landing pad; and
disposing a second bond pad on the first surface, wherein the second bond pad is electrically connected to the third landing pad.

5. The operating method of the hardwired switch as claimed in claim 1, wherein the fifth bond pad is electrically connected to the third bond pad through a first conductive bump, and the sixth bond pad is electrically connected to the fourth bond pad through a second conductive bump.

6. An operating method of a hardwired switch, comprising:
providing a first die;
inspecting a function of the first die to obtain an inspected result;
determining whether a first through silicon via is selectively disposed between a first landing pad and a fifth landing pad, between a second landing pad and a sixth landing pad, between a third landing pad and a seventh landing pad, or between a fourth landing pad and a eighth landing pad or not upon the inspected result, wherein the first landing pad, the second landing pad, the third landing pad the fourth landing pad are disposed on a first surface of the first die, and the fifth landing pad, the sixth landing pad, the seventh landing pad and the eighth landing pad are disposed on a second surface of the first die;
disposing a third bond pad on the second surface, wherein the third bond pad is electrically connected to the sixth landing pad;
disposing a fourth bond pad on the second surface, wherein the fourth bond pad is electrically connected to the eighth landing pad;
disposing a fifth bond pad on a third surface of the second die, wherein the fifth bond pad is located at a relative position of the third bond pad;
disposing a sixth bond pad on the third surface, wherein the sixth bond pad is located at a relative position of the fourth bond pad; and
stacking the first die above the second die, so that the second surface and the third surface are located between the first die and the second die, wherein the fifth bond pad is electrically connected to the third bond pad, and the sixth bond pad is electrically connected to the fourth bond pad.

* * * * *